United States Patent [19]

Narita et al.

[11] Patent Number: 4,913,790
[45] Date of Patent: Apr. 3, 1990

[54] TREATING METHOD

[75] Inventors: Tomonori Narita, Tokyo; Kimihiro Matsuse, Yokohama, both of Japan

[73] Assignee: Tokyo Electron Limited, Tokyo, Japan

[21] Appl. No.: 326,689

[22] Filed: Mar. 21, 1989

[30] Foreign Application Priority Data

Mar. 25, 1988 [JP] Japan .................................. 63-72995

[51] Int. Cl.⁴ ...................... C23C 14/34; C23C 16/00; C03C 15/00
[52] U.S. Cl. ........................... 204/192.13; 204/192.33; 204/298.03; 204/298.09; 204/298.32; 156/626; 156/643; 427/8; 427/248.1
[58] Field of Search ...................... 156/626, 643, 646; 427/8, 248.1; 118/666, 712, 725; 204/298 MT, 298 CS, 298 ET, 192.13, 192.12, 192.32, 192.33

[56] References Cited

U.S. PATENT DOCUMENTS

| | | | |
|---|---|---|---|
| 3,573,190 | 3/1971 | Bloom | 204/298 MT |
| 4,172,020 | 10/1979 | Tisone et al. | 204/298 MT |
| 4,324,631 | 4/1982 | Meckel et al. | 204/298 MT |
| 4,396,478 | 8/1983 | Aizenshtein et al. | 204/298 ET |
| 4,407,708 | 10/1983 | Landau | 204/298 MT |
| 4,565,601 | 1/1986 | Kakehi et al. | 204/298 ET |
| 4,648,952 | 3/1987 | Savov et al. | 204/298 MT |
| 4,687,544 | 8/1987 | Bersin | 204/298 ET |

FOREIGN PATENT DOCUMENTS 60-022635 2/1985 Japan .
63-65901 3/1988 Japan .

Primary Examiner—Nam X. Nguyen
Attorney, Agent, or Firm—Oblon, Spivak, McClelland, Maier & Neustadt

[57] ABSTRACT

A workpiece treating method includes a temperature rise step in which first temperature control is performed and a treatment step in which second temperature control is performed and is adapted to treat a workpiece whose emissivity of infrared rays in the temperature rise step is different from that in the treatment step. In the temperature rise step, the temperature of the workpiece is detected by a non-contact type temperature detecting means so as to perform the first temperature control. In the treatment step, the temperature of the workpiece is detected by a contact type temperature detecting means so as to perform the second temperature control.

7 Claims, 4 Drawing Sheets

TREATING METHOD

BACKGROUND OF THE INVENTION

1. Field of the Invention

The present invention relates to a treating method of a workpiece and, more particularly, to temperature control in deposition of a metal on a surface of a semiconductor substrate.

2. Description of the Related Art

In a conventional manufacturing process of semiconductor integrated circuits, physical vapor deposition (PVD), such as evaporation and sputtering deposition, is used as a technique for depositing a metal on a surface of a substrate. However, with advances in integration, speed, and density of an integrated circuit as in an ultra large scaled integrated circuit (ultra LSI), a great deal of attention has been paid to a technique for depositing a refractory metal, e.g., W (tungsten), having a resistance which is 1/10 or less that of polycrystalline silicon, in order to form a gate electrode and perform selective deposition of a metal in contact holes and through holes.

For such a purpose, chemical vapor deposition, which is excellent in deposition selectivity, is widely utilized. When a W thin film is to be selectively deposited on a substrate, e.g., a substrate having an aluminum film formed on its surface, by chemical vapor deposition, the substrate must be quickly heated, and its temperature must be controlled to a desired temperature afterward in order to improve deposition selectivity. In this case, the temperature of the substrate must be accurately detected for its temperature control. The following two methods are available for detection of the temperature: a method of detecting the temperature of a substrate by bringing a thermocouple as a contact type temperature detecting device into contact with the substrate; and a method of detecting the temperature of a substrate by detecting the radiation energy of infrared rays from the substrate using a pyrometer as a non-contact type temperature detecting device.

If, however, a thermocouple is used for temperature detection in order to perform such temperature control of a substrate, high reliability can be expected with respect to stable temperatures, but reliability is decreased with respect to quickly rising temperatures because it takes a considerably long period of time to increase the temperature of the thermocouple itself. Therefore, when the substrate is quickly heated, the thermocouple cannot follow the temperature rise. As a result, the difference between a temperature detected by the thermocouple and an actual temperature becomes large, and a set value to be kept constant after quick rise is greatly overshot. If such overshoot occurs, when a surface of the substrate consists of aluminum, the surface is melted. Hence, a CVD process cannot be performed. In addition, if CVD is to be applied onto a diffusion region of a silicon substrate, the reaction advances into the substrate, i.e., a phenomenon called "encroachment" occurs.

In contrast to this, if a pyrometer is used for temperature control of a substrate, the pyrometer can properly respond to quick heating because it has good response characteristics. However, when deposition of a metal on a surface of the substrate is started, since the emissivity of infrared rays radiated from the surface of the substrate prior to deposition is different from that of a deposited film material, emissivity of infrared rays radiated from the surface of the substrate is changed as deposition progresses. The pyrometer cannot follow this change. Therefore, temperature detection cannot be properly performed.

SUMMARY OF THE INVENTION

It is an object of the present invention to provide a workpiece treating method accompanied with heating, which can treat a surface of a workpiece while accurately controlling the temperature of the workpiece.

According to the present invention, there is provided a workpiece treating method comprising a temperature rise step in which first temperature control is performed and a treatment step in which second temperature control is performed and adapted to treat a workpiece whose emissivity of infrared rays in the temperature rise step is different from that in the treatment step, wherein a temperature of a workpiece is detected by non-contact type temperature detecting means in the temperature rise step so as to perform the first temperature control, and the temperature of the workpiece is detected by contact type temperature detecting means in the treatment step so as to perform the second temperature control.

DETAILED DESCRIPTION OF THE PREFERRED EMBODIMENTS

Figure 1:
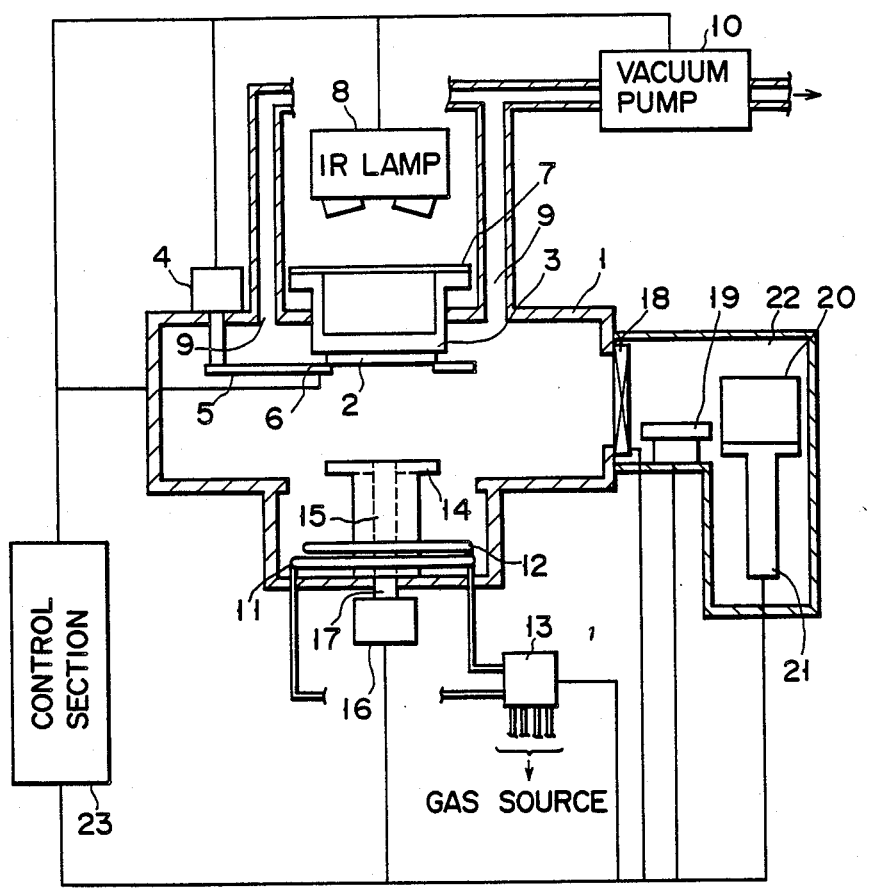
FIG. 1 shows a CVD apparatus used for a CVD process according to an embodiment of the present invention.

According to a method of present invention, a workpiece is heated from a room temperature to a predetermined treatment temperature, and the workpiece is then treated at this treatment temperature. In either of these heating and treating steps, the temperature of the workpiece is accurately controlled. In this case, the emissivity of infrared ray of the workpiece in the temperature rise step is different from that in the treating step. In accordance with this difference, the temperature of the workpiece in the temperature rise step is detected by a non-contact type temperature detecting means, whereas the temperature of the workpiece in the treating step is detected by a contact type temperature detecting means.

In the present invention, the temperature rise speed in the temperature rise step is preferably set to be 5° C./sec or more. At such a temperature rise speed, temperature detection cannot be properly performed by a contact type temperature detecting means. Therefore, the present invention can be effectively applied to such a case.

Heating of the workpiece can be performed by utilizing radiation of an infrared ray lamp, halogen lamp or a normal heater.

A pyrometer and a thermocouple can be respectively used as non-contact and contact type temperature detecting means used in the method of the present invention. However, the present invention is not limited to them.

The present invention can be applied to various treating methods, namely, evaporation, sputtering, thermal CVD, plasma etching, ozone ashing, and plasma ashing. Especially, the present invention can be suitably applied to a treatment which is not accompanied with generation of a plasma. Note that since a voltage is applied to a workpiece to be treated in plasma CVD and reactive ion etching, a thermocouple is difficult to use, and hence application of the present invention is difficult in these cases.

An embodiment wherein the method of the present invention is applied to formation of a thin film consisting of a refractory metal by a single wafer treatment in a thin film forming step by chemical vapor deposition in a semiconductor manufacturing process will be described below with reference to the accompanying drawings.

A mount base 3 is arranged at an upper portion of a hermetic, cylindrical Al (aluminum) reaction chamber 1 on which a jacket is arranged so as to cool its wall surfaces with cooling water or the like. A substrate to be treated, e.g., a semiconductor wafer 2, can be mounted on the mount base 3 such that a surface to be treated faces down. A support member 5 having a lifting mechanism 4 such as an air cylinder is arranged near the mount base 3. The support member 5 supports, e.g., the periphery of the semiconductor wafer 2 and fixes it to the mount base 3. A groove is formed at a predetermined position of the support member 5, and a contact type temperature detecting mechanism, e.g., a thermocouple 6 is arranged therein. More specifically, when the semiconductor wafer 2 is supported by the support member 5 on the mount base 3, the thermocouple 6 arranged on the support member 5 is brought into contact with the wafer 2. The thermocouple 6 is preferably constituted by an alumel-chromel thermocouple of the K type which can properly respond to temperatures from a room temperature to 600° C. An IR lamp (infrared ray lamp) or halogen lamp 8 is arranged above the mount base 3. The lamp 8 can heat the mount base 3 up to, e.g., 300° C. to 1,000° C. through a quartz glass window 7. Two exhaust ports 9 are formed in the upper wall of the reaction chamber 1 near the mount base 3. A vacuum pump 10, e.g., a turbo molecular pump, capable of evacuating the reaction chamber 1 to a desired pressure and exhausting a reactive gas and the like is connected to the exhaust ports 9.

An annular oxidation gas inlet port 11 having a large number of small holes is formed at a lower portion of the reaction chamber 1 so as to supply a film forming gas, e.g., $WF_6$ (tungsten hexafluoride), as an oxidation gas. Similarly, an annular reduction or carrier gas inlet port 12 having a large number of small holes is arranged to supply $H_2$ (hydrogen) as a reduction gas or Ar (argon) as a carrier gas. These gas inlet ports 11 and 12 are connected to gas supply sources through a flow rate control mechanism 13, e.g., a mass flow controller. In addition, a disk-like flow control plate 14 comprising a moving mechanism (not shown) utilizing linear movement by, e.g., a stepping motor is arranged between the mount base 3 and the gas inlet ports 11 and 12 so as to control gas flows.

A cylindrical space 15 having a diameter of 5 cm axially extends from the center of the disk-like flow control plate 14 toward the center of the semiconductor wafer 2 mounted on the mount base 3. The bottom portion of the space 15 is connected through a lens 17 to a non-contact type temperature detecting mechanism, e.g., a pyrometer 16 capable of detecting a temperature from radiation energy of infrared rays. The pyrometer 16 is arranged outside the bottom of the reaction chamber 1. More specifically, the pyrometer 16 is located to oppose the semiconductor wafer 2 mounted on the mount base 3 through the lens 17 and the space 15, and is designed to detect a temperature by detecting radiation energy of infrared rays of a portion of the wafer 2, e.g., a circular portion having a diameter of 2 to 3 cm and the center coinciding with substantially the center of the wafer 2.

A hermetic transfer preliminary chamber 22 is arranged on one side of the reaction chamber 1 through a gate valve 18 which can be opened/closed upon vertical movement. By opening/closing the gate valve 18, the semiconductor wafer 2 can be transferred in and out of the reaction chamber 1. The chamber 22 houses a hand arm 19, designed to freely expand/contract and rotate, for holding/transferring the wafer 2, and a base 21 which can be vertically moved while a cassette 20 storing, e.g., about 25 wafers 2, is mounted on the base 21.

A control section 23 performs temperature control based on detection results obtained by the above-described thermocouple and pyrometer respectively serving as temperature detecting mechanisms, and also performs operation and setting control of the film forming apparatus.

A method of selectively forming films on the semiconductor wafer 2 by using the above-described film forming apparatus will be described below.

The cassette 20 in which, e.g., about 25 semiconductor wafers 2 to be treated are stacked/stored at predetermined intervals is mounted on the base 21, which can be vertically moved, through an opening/closing port (not shown) of the preliminary chamber 22 by a robot hand or a manual operation. At this time, the gate valve 18 is closed, and the reaction chamber 1 has already been evacuated by the vacuum pump 10 to a desired pressure. After the cassette 20 is set in this manner, the opening/closing port (not shown) of the chamber 22 is airtightly closed, and the chamber 22 is then evacuated by a vacuum pump (not shown) to a pressure equivalent to that of the reaction chamber 1.

The gate valve 18 is then opened, and the height of the base 21 is adjusted while the desired pressure is maintained. Upon this operation, a desired one of the wafers 2 is picked up from the cassette 20 and is transferred into the reaction chamber 1 by using the hand arm 19 which can freely expand/contact. At this time, the support member 5 is lowered by the lifting mechanism 4, and the wafer 2 is mounted on the support member 5 while its surface to be treated faces down. Subsequently, the support member 5 is raised by the lifting mechanism 4, so that the wafer 2 is placed to be clamped between the mount base 3 and the support member 5 and be brought into contact with the thermocouple 6. The mount base 3 has already been heated by the lamp 8 by this time. In this case, if the contact surface of the support member 5 with the wafer 2 is constituted by a ceramic material or the like having a low heat conductivity, the temperature distribution of the wafer 2 becomes uniform. Hence, variations in treatment can be prevented. When mounting of the semiconductor wafer 2 on the mount base 3 is completed, the hand arm 19 is returned into the preliminary chamber 22, and the gate valve 18 is closed.

A treatment of depositing a W film on the surface to be treated of the semiconductor wafer 2, e.g., on an aluminum layer occupying several to several tens percent of the upper surface area is started. During the process, evacuation control of the reaction chamber 1 is always performed by the vacuum pump 10 so as to keep the chamber 1 at a desired reduced pressure, e.g., 100 to 200 mm Torr.

The surface to be treated of the semiconductor wafer 2 is quickly heated by the lamp 8 to a desired temperature range, e.g., about 370° C. At this time, the temperature of the wafer 2 is detected in a non-contact manner by detecting radiation energy of infrared rays radiated from the wafer 2 using the pyrometer 16, thus controlling an output to the lamp 8 by the control section 23. When the temperature of the wafer 2 is stabilized at the desired temperature, e.g., 370° C. after this quick heating, and a temperature detected by the thermocouple 6 arranged in contact with the wafer 2 is stabilized, a temperature detecting operation of the wafer 2 is manually or automatically switched from the pyrometer 16 to the thermocouple 6. As a result, temperature adjustment is performed by the control section 23 on the basis of temperatures detected by the thermocouple 6.

Figure 3:
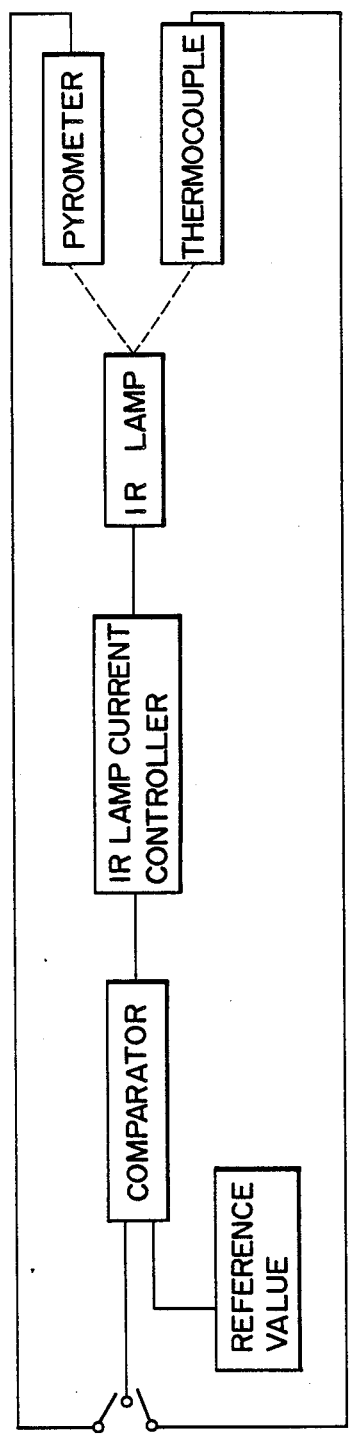
FIG. 3 is a block diagram showing an arrangement for temperature control of a wafer.
Figure 4:
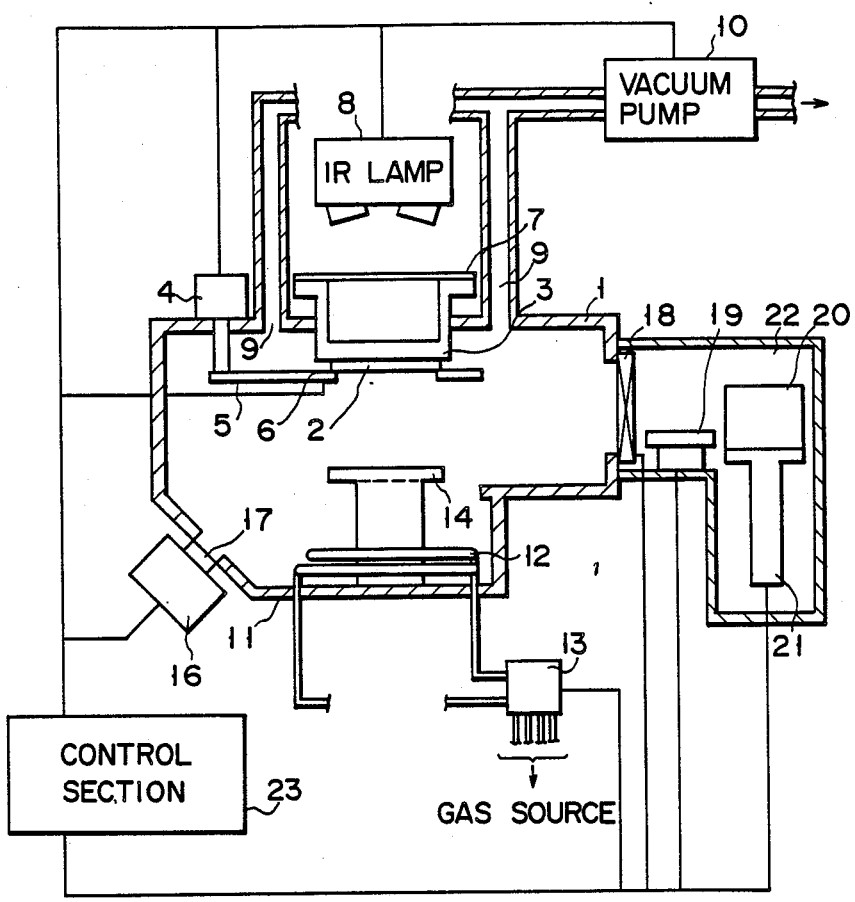
FIG. 4 shows a CVD apparatus wherein the position of the pyrometer is changed from that shown in FIG. 1.

Temperature control of the semiconductor wafer 2 by the control section 23 is performed in accordance with, e.g., the block diagram shown in FIG. 3.

When heating of the wafer 2 is started by the lamp 8, its temperature is detected by the pyrometer 16. Heating is performed in accordance with a predetermined temperature rise speed. The detection value obtained by the pyrometer 16 is compared with a reference value by a comparator. In this case, the detection value is compared with a value corresponding to 370° C., and the resultant output signal is supplied to the lamp 8 through a lamp current controller. The temperature of the wafer 2 is maintained at 370° C. in this manner. Thereafter, a temperature detecting operation is switched to the thermocouple 6, and temperature control is performed in the same manner as described above.

Subsequently, a film forming gas such as $WF_6$, a reducing gas such as $H_2$, and a carrier gas such as Ar are fed through the gas inlet ports 11 and 12 at a predetermined flow rate by using the flow rate control mechanism 13, thereby performing chemical vapor deposition. If the gas flow rates and the temperature of the semiconductor wafer 2 as a substrate to be treated are controlled as in the following table, a W film can be selectively deposited on a surface to be treated, e.g., an aluminum layer.

TABLE

| | Substrate temperature (°C.) | Time (sec) | Ar flow rate (cc/min) | $H_2$ flow rate (cc/min) | $WF_6$ flow rate (cc/min) |
|---|---|---|---|---|---|
| STEP 1 | 0 | 60 | 70 | 500 | 0 |
| STEP 2 | 370 | 60 | 70 | 500 | 0 |
| STEP 3 | 370 | 30 | 70 | 500 | 0 |
| STEP 4 | 370 | 30 | 70 | 500 | 0 |
| STEP 5 | 370 | 30 | 70 | 500 | 0 |
| STEP 6 | 370 | 30 | 10 | 500 | 0 |
| STEP 7 | 370 | 120 | 10 | 500 | 3 |
| STEP 8 | 0 | 60 | 100 | 0 | 0 |

Steps 1 to 8 in the above table will be described below. In step 1, supply of an Ar gas is started. In step 2, heating is started. After the substrate temperature becomes constant through steps 3 to 6, $WF_6$ and $H_2$ gases are supplied in step 7. Upon supply of the $WF_6$ and $H_2$ gases, the reaction progresses in accordance with the following reaction formula, and hence chemical vapor deposition is performed on the surface of the semiconductor wafer 2.

$$WF_6 + 3H_2 \rightarrow W + 6HF \uparrow$$

The treatment by the reaction between $WF_6$ and $H_2$ based on the above formula is executed. In this case, a switching operation of a temperature detecting means of the semiconductor wafer 2 from the pyrometer 16 to the thermocouple 6 in each step may be performed prior to the chemical vapor deposition in step 7. However, the switching operation may be performed in step 6, or may be performed at the time when the temperature detected by the thermocouple 6 is stabilized.

Figure 2:
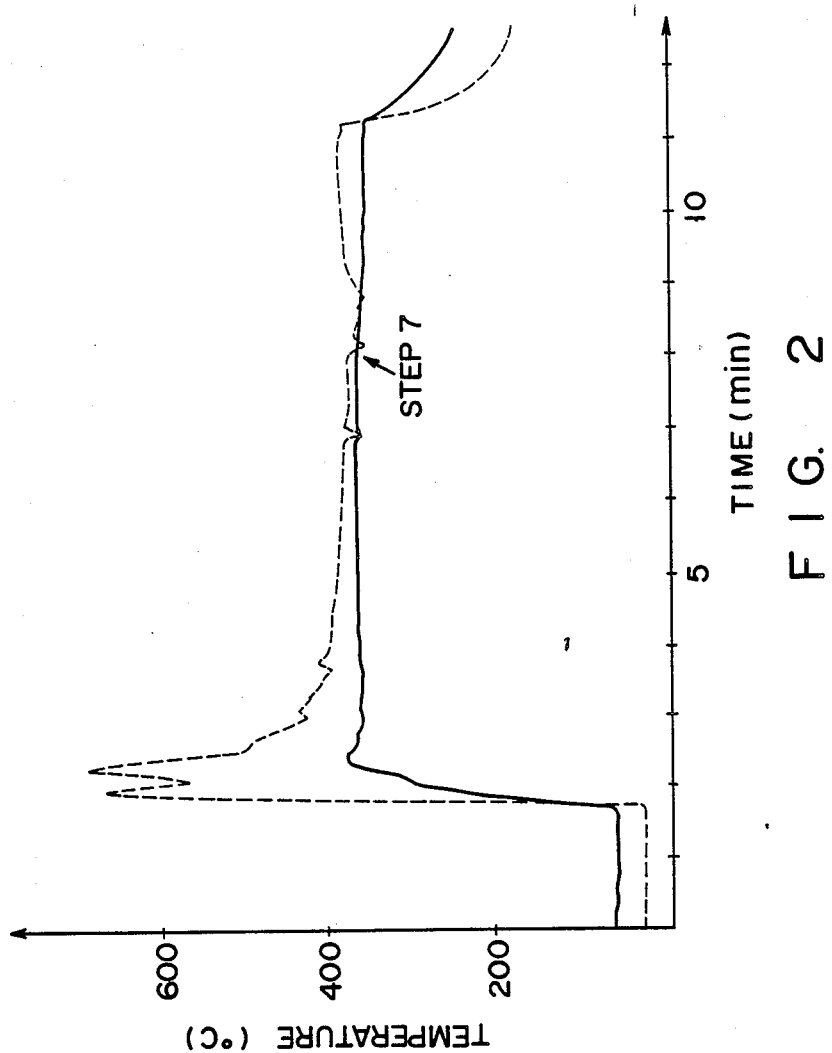
FIG. 2 is a graph showing temperatures detected by a thermocouple and a pyrometer when temperature control of a wafer is performed by using only the thermocouple in a process using the apparatus shown in FIG. 1.

FIG. 2 shows changes in temperature when the treatment shown in the above table is performed by temperature control using only the thermocouple 6. In FIG. 2, time is plotted along the axis of abscissa, and temperatures are plotted along the axis of ordinate. In this graph, a solid curve represents the temperatures detected by the thermocouple 6; and a dotted curve, the temperatures detected by the pyrometer 16. As is apparent from this graph, when the wafer 2 is quickly heated by the lamp 8, the thermocouple 6 having a slow response speed indicates near 370° C., but the pyrometer 16 having a high response speed indicates 600° C. or more. Thus, the actual temperature considerably overshoots the set temperature. In contrast to this, during the chemical vapor deposition in step 7, in spite of the fact that the thermocouple 6 exhibiting high reliability when a temperature is stabilized indicates near 370° C., the temperatures detected by the pyrometer 16 vary because the emissivity of the surface to be treated is different from that of the deposited substance and the pyrometer cannot follow changes in emissivity.

As is apparent from the above description, it is advantageous that temperature control is executed on the basis of results obtained by detecting temperatures using the pyrometer 16 during a time period of quick heating to which the thermocouple 6 cannot respond, and temperature control is executed on the basis of results obtained by detecting temperatures using the thermocouple 6 during a time period in which a treatment accompanied with changes in emissivity to which the pyrometer 16 cannot respond is performed.

Note that unnecessary films such as natural oxide films formed on the surface of the semiconductor wafer 2 are removed by plasma etching in the chamber 1 prior to execution of the above-described treatment.

The flow of a reactive gas can be controlled so as to bring the reactive gas into contact with the surface to be treated of the set semiconductor wafer 2 more uniformly by adjusting the position of the disk-like flow control plate 14 arranged between the mount base 3 and the gas inlet ports 11 and 12 by using the moving mechanism.

When the formation of the desired film is completed, supply of the reactive gas is stopped, and the support member 5 is lowered by the lifting mechanism 4 with the wafer 2 supported by the support member 5. The gate valve 18 is then opened. The wafer 2 is transferred out of the reaction chamber 1 by using the hand arm 19 which can freely expand/contract and rotate. At the same time, the gate valve 18 is closed, and hence the treatment is completed.

In the above-described embodiment, the W film is deposited on a surface to be treated by $H_2$ reduction using $WF_6$ as a film forming gas. However, a W film may be deposited on the surface by using an $SiH_4$ gas as a reducing gas and reducing $WF_6$ in accordance with the following formula.

$$2WF_6 + 3SiH_4 \rightarrow 2W + 3SiF_4 + 6H_2$$

The treatment of the present invention is not limited to a chemical vapor deposition treatment. Any treatment can be employed as long as it is accompanied with changes in emissivity of infrared rays of a surface to be treated after a substrate to be treated is quickly heated. For example, the present invention can be properly applied to an etching treatment. In addition, a device for quickly heating a substrate to be treated is not limited to an IR lamp or halogen lamp. For example, an electric heater may be employed. Furthermore, temperature detecting mechanisms are not limited to a thermocouple and a pyrometer.

Moreover, in the above embodiment, a single wafer treatment is performed. However, the present invention is not limited to this, but can be applied to a batch treatment in which a large number of semiconductor wafers are simultaneously treated. In this case, it is difficult to detect the temperatures of all the wafers.

However, temperature detection of wafers on both the sides and the center, i.e., three wafers in total, will be sufficient.

As has been described above, according to the present invention, either in a temperature rise step accompanied by quick heating or in a constant temperature step accompanied by changes in emissivity, the temperature of an objected to be treated can be accurately detected, and hence a treatment can be performed while temperature control is performed with high precision.

What is claimed is:

1. A workpiece treating method comprising a temperature rise step in which first temperature control is performed and a treatment step in which second temperature control is performed and adapted to treat a workpiece whose emissivity of infrared rays in the temperature rise step is different from that in the treatment step, wherein a temperature of the workpiece is detected by non-contact type temperature detecting means in the temperature rise step so as to perform the first temperature control, and the temperature of the workpiece is detected by contact type temperature detecting means in the treatment step so as to perform the second temperature control.

2. A method according to claim 1, wherein said workpiece is a semiconductor substrate.

3. A method according to claim 1, wherein a temperature rise speed in the temperature rise step is not less than 5° C./sec.

4. A method according to claim 1, wherein the workpiece is heated by radiation of an infrared ray lamp, halogen lamp or an electric heater.

5. A method according to claim 1, wherein said non-contact type temperature detecting means comprises a pyrometer.

6. A method according to claim 1, wherein said contact type temperature detecting means comprises a thermocouple.

7. A method according to claim 1, wherein said method comprises a method selected from the group consisting of evaporation, sputtering, thermal CVD, plasma etching, sputter etching, ozone ashing, and plasma ashing.

* * * * *